United States Patent [19]

Redmond et al.

[11] 3,928,663

[45] Dec. 23, 1975

[54] MODIFIED HECTORITE FOR ELECTROLESS PLATING

[75] Inventors: John Peter Redmond, Mechanicsburg; Daniel Marshall Andrews, Harrisburg, both of Pa.; Charles Parsons Brooks, Rural Hall, N.C.; Dominic A. Cinalli, Burlington, N.J.; Joseph Francis Merlina, Harrisburg, Pa.

[73] Assignee: AMP Incorporated, Harrisburg, Pa.

[22] Filed: Apr. 1, 1974

[21] Appl. No.: 457,012

[52] U.S. Cl. .................. 427/304; 427/98; 427/305; 427/314

[51] Int. Cl.$^2$ ........................ C23C 3/02; B05D 3/04

[58] Field of Search .......... 117/47 A; 427/304, 305, 427/314, 98

[56] References Cited

UNITED STATES PATENTS

| | | | |
|---|---|---|---|
| 3,011,920 | 8/1962 | Shipley | 117/213 |
| 3,147,154 | 9/1964 | Cole et al. | 117/130 E |
| 3,222,218 | 12/1965 | Beltzer et al. | 117/47 A |
| 3,338,740 | 8/1967 | Katz | 117/130 E |
| 3,379,556 | 4/1968 | Chiecchi | 117/47 A |
| 3,523,824 | 8/1970 | Powers et al. | 117/239 |
| 3,546,009 | 12/1970 | Schneble et al. | 106/1 X |
| 3,546,011 | 12/1970 | Knorre et al. | 117/212 |
| 3,772,056 | 11/1973 | Polichette et al. | 117/47 A |

OTHER PUBLICATIONS

Brinner, "Electroless Plating Comes of Age", Metal Finishing, December, 1954, p. 65.

*Primary Examiner*—Ralph S. Kendall
*Assistant Examiner*—John D. Smith
*Attorney, Agent, or Firm*—Russell J. Egan, Esq.

[57] ABSTRACT

A method and composition of matter useful for rendering an insulating material, self-catalytic to deposition of electroless metal from solutions thereof are shown. A base exchangeable clay material such as hectorite is base exchanged with a source of cations of a metal selected from Group I-B and VIII of the Periodic Table of Elements, preferably nickel or copper, and thereafter, the cation exchanged hectorite is heated under reducing conditions.

This thermal treatment activates the exchanged hectorite as a catalyst to induce metal deposition in electroless plating baths. Without such a treatment the exchanged hectorite is not catalytic. The structure of the hectorite is altered by the thermal treatment as it no longer swells or gels when immersed in water. In addition the mechanical strength of the material is increased by the "sintering like" treatment.

The modified base exchanged material can be incorporated or coated on insulating materials to provide the exterior or interior surfaces thereof with a catalytic sensitivity to deposition of electroless metal. The methods and compositions are useful in processes for manufacture of printed circuitry on substrates such as films, glass reinforced laminates, tapes, and boards. Methods of molding printed circuit substrates in desired geometrical form with vias located in predetermined pattern are disclosed along with chemical and mechanical methods of etching the surface of resin to expose base exchanged mineral that serves as the catalyst for electroless plating.

2 Claims, No Drawings

MODIFIED HECTORITE FOR ELECTROLESS PLATING

This invention relates broadly to methods and compositions of matter useful in the manufacture of metallized plastics. More specifically, this invention relates to a method and a composition of matter which sensitize various insulating substances to the subsequent deposition of electroless metal and thereby prepares them for metallizing.

In recent years the manufacture and use of printed circuit boards has become widespread. These circuit boards are typically comprised of an insulating material which may be a thermoplastic resin or thermosetting resin or composite structure based on organic resins, paper, wood and other similar materials. The printed circuits may be formed from one layer or two layers or multiple layers of insulating material with conductive patterns thereupon or they may be three-dimensional structures with conductive patterns therein.

In the manufacture of printed circuit boards comprised of insulating panels with conductive passageways therethrough (vias), the technique has been to seed and sensitize the walls surrounding the passageways or holes before depositing the electroless metal thereupon. It is conventional to contact a portion of the insulating base material with an aqueous solution of stannous chloride having a pH of about 6.5 to 7.5 and after washing the insulating material thereafter immersing it in an acidic aqueous solution of palladium chloride having a pH of about 5. Similar one-step and two-step processes for accomplishing the seeding and sensitizing of the insulating material are also known.

Another technique proposed for mitigating the processing problems in manufacture of metallized insulating substrates for printed circuitry and for improving the performance characteristics of that circuitry are the techniques and compositions described in U.S. Pat. No. 3,546,009. There, the insulating compositions are rendered catalytic to the deposition of electroless metal by incorporating a modified base exchanging material into the insulating base and replacing the replaceable cations with ions of a metal catalytic to the reception of electroless metal.

A disadvantage associated with the techniques of U.S. Pat. No. 3,546,009 is the fact that an initiating or induction period occurs before plating begins. This time period is in the order of many minutes and is dependent on the concentration of the base exchange catalyst. Another disadvantage is that the base exchange metal catalysts are noble metals which are expensive.

A third disadvantage is the fact that metal ions are employed which are not as effective as catalysts for electroless plating as are the corresponding zero valent metal.

Other problems have been encountered with the techniques heretofore used for sensitizing the insulating material. A primary difficulty is attributable to the fact that the thermosetting or thermoplastic resins are typically hydrophobic and are not readily wetted with the aqueous solutions used in the sensitization processes. It has also been found that where the conventional seeding and sensitizing solutions are used to prepare the walls of passageways (vias) in three dimensional panels for electroless metal deposition, where the surface of those panels already has foil deposited thereupon, the bond between the surface foil and the subsequently deposited plating on the sides of the passageways is weak. This is apparently due to the formation of a layer of ionic material on the edges of the surface foil. The same problem is encountered where two or more layers of the same or different metals are desired to be clad upon an intially deposited surface layer of electroless metal. Here, the bonds between the subsequently deposited metal layers and those initially deposited are unsatisfactorily weak. There is also a preferrential build-up of metal around the entrance to the via because the passageway walls are not by nature as catalytic as the laminated foil. This may result in skip spots in the metallization or open circuits particularly in blind holes.

There are other areas in which the art of manufacturing metallized insulating substrates can be improved. It is important to provide more active catalysts for electroless deposition than have heretofore been available. It is also important to increase the catalytically active area of modified insulators so that uniform and reliable results are obtained. Still another characteristic of the compositions of the prior art wherein improvement can be made is in the stability of the modified base exchangeable material.

Although some success has been achieved with prior art techniques and compositions it has been found that the modified base exchange materials of the prior art impair the structural properties of the substrate into which they are introduced and that they cannot be compressed or transfer molded at high temperatures except with an unacceptable decrease in that catalytic activity. A further weakness in prior art compositions is in the strength of adhesion of the deposited electroless metal on the modified surface of the insulating substrate. Where the bonding site for the deposited metal is not entrained within the matrix of the substrate the adhesion of the deposited electroless metal is unsatisfactory.

It is thus the primary object of this invention to provide improved methods and compositions of matter for modifying insulating materials to render them catalytic to the reception of electroless metal.

It is a further and more specific object of this invention to modify a base exchangeable material by means of novel methods and thereby produce new compositions of matter which, when mixed with a resin and molded into a substrate, produces a substrate from which circuit boards in various configurations can be economically produced and metallized by electroless deposition procedures.

It is still a further and important object of this invention to provide a modified base exchangeable material which is a more active catalyst to the ultimate deposition of electroless metal and which employs less expensive metals than the noble metals of the prior art. It is a related object of this invention to provide a catalytic substrate for deposition of electroless metal which does not require an induction period in the electroless bath.

It is a further and related object of this invention to provide a modified base exchangeable material having a higher effective surface area and having a long term stability which is superior to those heretofore available.

It is still another object of this invention to provide a modified hectorite which does not impair the structural properties of the substrates into which is introduced and which can be compressed or transfer molded at higher temperatures without decreasing catalytic activity.

It is yet another object of this invention to provide a substrate having a catalyst entrained within it which has higher adhesive characteristics for the ultimatley deposited electroless metal.

These and other objects of this invention are achieved in a method for rendering substances catalytic to deposition of electroless metal wherein a base exchangeable material is modified by replacing the alkali or alkaline earth metal ions in the crystal lattice structure thereof with metal ions from Groups I-B and VIII of the Periodic Table and thereafter reducing those metal ions by maintaining the base exchangeable material under reducing conditions. Although a number of inorganic base exchangeable materials are suitable for use in the methods and compositions of this invention, a preferred species is hectorite, both natural and artificial. The hectorite is preferably base exchanged with cations of nickel and copper and these cations are reduced by maintaining the hectorite in an atmosphere of hydrogen at a temperature from 200° to 450° C. for at least one-fourth hour.

The invention also includes the cation-replaced base exchangeable material which has been reduced, as well as a base exchangeable material containing reduced cations or atoms of the metals of Group I-B and VIII of the Periodic Table in its crystal lattice structure.

The modified base exchangeable material with the ions of the catalytic metal entrained in lattice network may then be dispersed directly within an organic resin. That resin may be molded into a solid form which becomes a blank suitable for further treatment to deposit electroless metal on its surfaces or upon the surfaces of holes therethrough. Alternatively, the resins containing the modified base exchangeable material can be used to impregnate such material as paper, wood, fiberglass or other materials to form laminates suitable for forming blanks which can be metallized into printed circuitry. The resin with the modified base exchangeable material therein can also be formed or molded into films or strips which can thereafter be combined or fabricated into a composite for a printed circuit board. Still a further procedure includes the application of a film of adhesive or ink in which the modified base exchangeable material is dispersed.

The base exchangeable materials which may be used in the methods and in the compositions of this invention are:

*a.* clay minerals such as montmorillonite, which is the principle constituent of clay materials such as bentonite and fuller earth, including beidillite, nontronite, hectorite and saponite, both natural and artificial;

*b.* natural and artificial zeolites;

*c.* materials that have high base exchange capacity, that on heating release their chemically bound water which alter their structure so that they no longer swell or are plasticized by water.

To modify the base exchangeable material, that material is contacted with an aqueous solution of a compound of a metal of Group I-B or VIII of the Periodic Table. The rate at which the ions in the base exchangeable material are replaced is increased with increased concentration of the replacing cation in the aqueous solution and is also increased with higher temperatures. After substantially all of the base exchangeable cations are replaced, the modified base exchangeable material may be washed with water.

The metals of Group I-B and VIII of the Periodic Table which are preferred for use in modifying the base exchangeable material are copper, nickel, palladium, platinum, gold, silver, rhodium, cobolt, iron, and iridium. Many of the compounds of these metals may be successfully employed as the source of replacing ions. Soluble metal compounds are preferred such as the chlorides, nitrates, carbonates, and sulfates.

The base exchangeable material having the replacement ions therein is then reduced by maintaining it under reducing conditions. The material is reduced at temperatures broadly in the range of 100° to 600°C., and preferably in the range of 400° to 500°C. Suitable reducing atmospheres may consist of hydrogen, carbon monoxide, hydrogen sulfide and ammonia. The base exchange material is maintained in the reducing atmosphere for at least 5 minutes, and preferably for at least 15 minutes until substantially all of the metal cations in the crystal lattice structure are reduced.

The treatment of the base exchange material at elevated temperatures in a reducing atmosphere has the beneficial effect of changing the structure of hectorite so that it no longer swells when it is subsequently placed in aqueous electroless solutions. When the base exchanged material is thereafter immersed in a commercial electroless bath either itself or as a dispersion in a resinous material, it does not swell and is securely plated with the electroless metal.

It has also been found that the nickel cation in hectorite can be reduced by media other than those described above. Hydrogen plasma, sodium borohydride, trimethylamine borane, hydrazine and hydroquinone, among others, are suitable for reducing the nickel or copper cations to zero valent state.

The electroless metal solutions which are used to deposit metal on a modified base exchange material or on an insulating surface rendered active by incorporation of the modified base exchange material of this invention are widely known in the art. U.S. Pat. No. 3,095,309 describes electroless copper solutions which are broadly comprised of cupric ions, a reducing agent for the cupric ions, a complexing agent for those ions and a pH adjuster. Electroless nickel solutions have been described in Brenner, "Metal Finishing," November, 1954, pages 68 to 76. These solutions are comprised of a nickel salt, a reducing agent for that salt, and a complexing agent. Electroless gold plating baths contain analogous components and these are disclosed in, among others, U.S. Pat. No. 2,976,181.

The invention is further described in the following examples which show the preparation of modified, clay-filled, high-temperature, molded printed circuit boards which are catalytic to electroless plating.

EXAMPLE I

This example shows the preparation of a modified hectorite using nickel carbonate. Raw clay is first refined by hydrating it which process causes it to swell and changes the clay into a gel. The gel is then centrifuged to separate it from foreign matter such as sand, stones, etc. An ion exchange resin treated with ammonium chloride is mixed with the gel thereby exchanging the sodium ion in the gel with ammonium ion and the resin is separated from the gel. An ammoniacal solution of nickel carbonate is added in sufficient quantity to give 2 parts by weight of nickel metal to 100 parts by weight of dried hectorite. Thereafter the gel is spread and dried in a hot air conveyor oven at a temperature of 80°C for 2 hours. This hot air treatment dries off the ammonium compounds leaving behind a nickel substituted hectorite.

The hectorite is then pulverized to a particle size less than 200 mesh and this powder is fired in a reducing atmosphere comprising 75 percent by volume of hydrogen and 25 percent by volume of nitrogen for 15 minutes at 450°C. The fired powder is then blended with polyimide resin.

EXAMPLE II

Hectorite gel prepared according to the method of Example I is mixed with an aqueous solution of nickel chloride of sufficient concentration to give a mixture containing 2 parts by weight nickel to 100 parts by weight of dry hectorite. The solution is stirred until thoroughly mixed, then dried, powdered and fired as described in Example I. The fired powder is then washed with water to remove sodium chloride, dried at 110°C and blended with plastic resin.

EXAMPLE III

This example is similar to Example I and shows the preparation of a modified hectorite using nickel chloride. After refinement of the raw clay as described in Example I, 3 parts by weight of the hectorite in water is used to make the gel which is mixed with the ion exchange resin that has been treated with an aqueous solution containing nickel chloride. This treatment replaces the sodium ion in the hectorite gel with nickel ion. The gel is separated from the ion exchange resin by filtration and then is spread, dried, pulverized and fired in a reducing atmosphere as described above in Example I. The powder is then blended with the polyimide resin.

EXAMPLE IV

Hectorite gel prepared according to the steps described in Example I is first exchanged with ammonium ions as also described in Example I. The gel is then mixed with an ammoniacal solution of copper carbonate to give 2.2 parts by weight of copper per 100 parts of dried hectorite, for 2 hours at room temperature. After copper is substituted in the expanded crystal lattice, the gel is dried, fired and blended as described in Example I.

EXAMPLE V

This example shows the transfer molding of a polyimidehectorite blend. A mixture of polyimide and ion exchanged hectorite powder is formed and the two constituents are blended together. The mixture contains 60 percent by weight of polyimide resin blend and 40 percent by weight of ion exchanged hectorite powder. The polyimide resin constituent comprises 25 per cent by weight of Kermid 601 obtained from Rhodia Corporation and 75 percent by weight of partially cured Kermid 1000 also obtained from Rhodia Corporation. This blend of polyimide resins has satisfactory flow properties for transfer molding.

A quantity of the powder is compacted at room temperature under a load of 2,000 psi. The compacted preform is then heated by dielectric heaters at 250°F. The hot preform is transfer molded at a temperature of 450°F and at a pressure of 9,000 psi for 1½ minutes in a two cavity mold. One cavity contains pins to demonstrate feasibility of molding holes (vias) within the mold and the other cavity molds plain boards to test the effect of drilling holes.

EXAMPLE VI

This example describes the transfer molding of a blend comprising phenolic resins and modified hectorite. A mixture containing 60 per cent by weight of unfilled phenolic resin No. 26124 obtained from Durez Division, Hooker Corporation and 40 per cent by weight of ion exchanged hectorite are blended together. The preforms are made and heated as described in Example V. The hot preform is placed in a transfer press and is molded at a temperature of 325°F and a pressure of 9,000 psi for 4 minutes. The mold contains pins so that the molded substrate contains vias in the desired configuration.

EXAMPLE VII

This example describes the casting of an epoxy-hectorite printed circuit board. A mixture containing 60 per cent by weight of an epoxy resin comprising 100 parts of Epon 828 obtained from Shell Corporation and 10 parts of triethyltetramine, the curing agent, and 40 per cent by weight of modified hectorite are stirred to a uniform consistency. The epoxy-hectorite mixture is poured into a mold and is cured for 24 hours at room temperature.

EXAMPLE VIII

This example described the electroless plating of a hectorite-filled printed circuit board and specifically the additive plating of nickel on a polyimide/hectorite transfer molded board.

A composite board containing catalytic hectorite (prepared as described in Example V) is first sanded in selected areas to expose the catalytic hectorite covered by the polyimide rich surface layer formed during the molding process. Holes (vias) are drilled in the plain board which also exposes the catalytic hectorite. Thereafter the composite board is cleaned with detergent and rinsed and then is immersed in an electroless nickel bath. The nickel bath is that described by A. Brenner and G. E. Riddell in U.S. Pat. No. 2,532,283 and contains:

| | |
|---|---|
| Nickel chloride | 30 g/l |
| Sodium glycollate | 50 g/l |
| Sodium hypophosphite | 10 g/l |
| pH | 4.6 |
| Temperature | 190°F |

The board is maintained in the bath at a temperature of 190°F for 10 minutes.

Upon immersing the board in the plating solution the nickel immediately begins depositing in the sanded areas on the board and on the walls of the drilled holes. There is no induction or initiation period. Uniform coatings of nickel approximately $30 \times 10^{-6}$ inches thick are deposited in areas where the catalytic hectorite is exposed. No nickel is deposited on the areas not abraded because of the polyimide rich surface layer formed during the molding operation. The board is satisfactory for non-precision conductive circuitry.

EXAMPLE IX

A circuit board containing 40 per cent by weight modified hectorite as prepared in Example V is covered with a solid film photoresist of the Reston Type 6 procured from the DuPont Company, or a liquid resist KMER produced by the Kodak Co. After lamination of the photoresist to the board, or liquid coating, the film is exposed and developed. The board is then etched in the resist free region by a solution consisting of 75 percent by weight hydrazine hydrate and 25 percent by weight caustic at 110°F for 10 seconds.

The etched board is then plated in the electroless nickel bath described in Example VIII and is maintained therein for approximately 60 minutes at 190°F.

In the regions where the nickel is deposited it is almost $200 \times 10^{-6}$ inches thick. The remaining photoresist is removed to leave a well defined conductor pattern on the substrate. The photoresist prevents lateral growth of the conductor during the plating cycle. The line resolution is limited by the mask, light source, light scattering by the substrate and the sensitivity of the photoresist to ultraviolet light and the etching solution. Boards were prepared with 2 mil lines and 2 mil spacings. The boards are suitable for high resolution plated circuitry.

EXAMPLE X

This example describes the semi-additive plating of copper on polyimide/hectorite boards. A board such as is obtained in Example V is first etched all over by a saturated solution of chromium trioxide and fluoroboric acid at 80°C for a minimum of 10 minutes and after thoroughly rinsing, the polyamide-imide board is further etched by a constric solution caustic at 110°F for approximately 10 seconds, or is sanded all over as described above in Example VIII. The board is then plated with a conductive film of copper in an electroless copper bath as is taught in U.S. Pat. No. 2,874,072. The composition of the bath is as follows:

| | |
|---|---|
| Copper nitrate | 15 g/l |
| Sodium bicarbonate | 10 g/l |
| Rochelle salt | 30 g/l |
| Formaldehyde | 100ml/l |
| pH | 11.5 |
| Temperature °F | 75 |

A photoresist is then applied and developed and the area free of resist is plated to a thickness of ½ mil in a copper electroplating bath such as that reported in "Metal Finishing Guidebook," Pg. 264 (1969), having the following compositions

| | |
|---|---|
| Copper sulfate | 28.0 oz/gal. |
| Sulfuric acid | 7.0 oz/gal. |
| Current density | 20–50 ampere/ft² |
| Temperature °F | 60–120 |
| Voltage | 1–4 |

A gold flash is then deposited on the electroplated copper by Selrex gold plating bath such as Pur-A-gold 125 obtained from the Selrex Corporation. Thereafter the photoresist is stripped off and the initial electroless copper flash is etched away by immersing the board in a standard ferric chloride etch for printed circuit boards at 50°C for 1 minute.

EXAMPLE XI

The example describes the preparation of a printed circuit board using an ion exchanged hectorite which has not been reduced. The polyimide board containing the ion exchanged hectorite which has not been reduced was prepared by the procedure described in Example IV. The board was then prepared for electroless plating by the procedure described in Example IX, but is was not possible to electrolessly deposit nickel on the board since the hectorite was non-catalytic.

In producing the circuit boards of the invention, the modified hectorite may be mixed with polyimide in amounts ranging from 20 per cent by weight of modified hectorite to 80 per cent by weight of modified hectorite, the balance being polyimide. It is preferred to use a mixture of 40 per cent hectorite and 60 per cent polyimide.

The hot preforms can be transfer molded at temperatures between 400° and 450°F and at pressures from 4,000 to 10,000 psi for periods of from 1 to 4 minutes. To increase, flexure strength of the composite boards, various coupling agents may be used. For example, the hectorite may be treated with a 5 per cent aqueous solution of A1100 coupling agent (gamma-amino-propyltricthoxysilane) obtained from Union Carbide Corporation. The use of such a coupling agent provides a 10 to 20 percent increase in flexure strength without adversely affecting the catalytic properties of the board toward electroless plating. The hectorites may also be treated with acrylic acids and thin epoxy coatings to improve their bonding to the polyimide matrix. Also, metal or plastic carrier strips may be molded into the boards for facilitating handling in further processing steps, particularly the metallization steps.

In preparing the circuit boards for plating, the board may be sanded or abraded or chemically etched if the board is to be used for non-precision conductive circuitry. Where precision, high-resolution, plated circuitry is to be prepared it is preferable to use a solid photoresist but liquid photoresists such as type KPR-3 obtained from the Kodak Company are useful. One drawback to using liquid resists is that problems are encountered in removing the resist from the molded holes in the board.

The modified hectorite and resins containing modified hectorite described are less expensive to produce than materials previously used which contain noble metals. They have higher catalytic effect than materials substituted with metal cations and require no induction period when placed in an electroless bath. They may be used with success in molded panels containing three dimensional circuit vias which have improved stability and adhesiveness to deposited electroless metal as well as reduced cost of manufacture.

What is claimed is:

1. In a method for rendering a substance selfcatalytic to deposition of electroless metal in which hectorite is employed and the replaceable cations in said hectorite are exchanged with a cation of a metal selected from the group consisting of nickel, copper, palladium, platinum, gold, silver, rhodium and iridium, the improvement which comprises: modifying the lattice structure of said hectorite to stabilize it against swelling when immersed in aqueous electroless solutions by reducing the exchange metal cations at elevated temperatures in a reducing atmosphere consisting essentially of a compound selected from the group consisting of hydrogen, carbon monoxide, hydrogen sulfide and cracked ammonia.

2. In a method for rendering a substance selfcatalytic to deposition of electroless metal in which hectorite is employed and the replaceable cations in said hectorite are replaced with cations of nickel, the improvement which comprises: modifying the structure of said hectorite and stabilizing it against swelling when immersed in aqueous electroless solutions, by reducing said cations of nickel by maintaining said base exchanged hectorite in an atmosphere of hydrogen at a temperature of from 100° to 600°C, and at times from 5 to 15 minutes.

* * * * *